United States Patent
Jinbo

(10) Patent No.: US 6,456,534 B2
(45) Date of Patent: Sep. 24, 2002

(54) METHOD FOR CONTROLLING A FLASH MEMORY ERASE OPERATION AND FLASH MEMORY ERASE OPERATION CONTROLLER

(75) Inventor: Toshikatsu Jinbo, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/877,940

(22) Filed: Jun. 8, 2001

(30) Foreign Application Priority Data

Jun. 9, 2000 (JP) ........................................ 2000-174380

(51) Int. Cl.$^7$ .............................................. G11C 16/06
(52) U.S. Cl. ............................ 365/185.25; 365/185.26; 365/185.33
(58) Field of Search ...................... 365/185.29, 185.33, 365/185.25, 185.26, 185.11

(56) References Cited

U.S. PATENT DOCUMENTS

| | | | | |
|---|---|---|---|---|
| 4,928,265 A | * | 5/1990 | Higuchi et al. | ........ 365/189.01 |
| 5,077,691 A | | 12/1991 | Haddad et al. | ............. 365/218 |
| 5,521,866 A | * | 5/1996 | Akaogi | ................. 365/185.29 |
| 5,748,535 A | * | 5/1998 | Lin et al. | ................ 365/185.22 |
| 5,781,477 A | * | 7/1998 | Rinerson et al. | ........ 365/185.29 |
| 6,031,774 A | * | 2/2000 | Chung | ......................... 365/204 |

FOREIGN PATENT DOCUMENTS

| | | | | |
|---|---|---|---|---|
| JP | 5-174588 | 7/1993 | ............ | G11C/16/06 |
| JP | 6-275842 | 9/1994 | ......... | H01L/29/788 |
| JP | 10-172293 | 6/1998 | ............ | G11C/16/04 |
| JP | 10-214491 | 8/1998 | ............ | G11C/16/02 |
| JP | 10-275484 | 10/1998 | ............ | G11C/16/02 |

* cited by examiner

Primary Examiner—David Nelms
Assistant Examiner—Thong Le

(57) ABSTRACT

A flash memory erase operation controller has a common discharge circuit which directly electrically connects at least one of a source, a drain, and a substrate making up memory cells forming a flash memory to a gate during an erase operation in the flash memory.

13 Claims, 13 Drawing Sheets

METHOD FOR CONTROLLING A FLASH MEMORY ERASE OPERATION AND FLASH MEMORY ERASE OPERATION CONTROLLER

BACKGROUND OF THE INVENTION

1. Field of the Invention

The present invention relates to a flash memory erase operation controller and to a method for controlling a flash memory erase operation, and more particularly it relates to a high-speed flash memory that eliminates malfunctioning by reliably discharging a residual charge remaining in a memory cell in a short period of time.

2. Related Art

Flash memories have been known in the past, and a method of erasing a flash memory of the past, such as the substrate erase method, is shown in the equivalent circuit diagram and structural cross-sectional view of FIG. 14 and FIG. 15.

Specifically, in this substrate erase method, the gate voltage Vg is set to a negative voltage Vneg (for example, −8 V), the source voltage Vs and drain voltage Vd being left in the open state, and the substrate voltage Vb being set to a positive voltage Ves (for example, −8 V), so that floating electrons accumulated on the floating gate 158 are discharged to the substrate, thereby achieving erasure.

This memory cell is formed by a forming an N well 152 on a P-type substrate 151 and forming a P well 153 electrically isolated from the P-type substrate 151, forming an N-type diffusion layer 154 on the N well 152 for the purpose of applying a voltage to the N well 152, and forming a P-type well diffusion layer 155 on the P well 153 for the purpose of applying a voltage to the P well 153.

Additionally, in this memory cell an n-type source diffusion layer 156 and an N-type drain diffusion layer 157 are formed on the P well 153, and a floating gate 158 and control gate 159 are formed.

Each of the diffusion layers 156 and 157 are separated by a field insulation film 160.

By adopting the above-noted structure, it is possible to use the substrate erase method, in which a positive voltage is applied to a substrate part of the memory cell.

FIG. 9 is a block diagram showing an example of the structure in a flash memory of using the above-described substrate erase memory, and in the operation of this device, a gate of the memory cell MC1 is controlled by a row decoder 1 via a row line WL, and when erasing is to be performed, an output voltage Vneg of a negative voltage boosting circuit 2 is supplied to the gate of the memory cell via the row decoder 1.

At times other than when an erase operation is performed, an N-type MOSFET MN6 is provided at the connection node with the negative voltage Vneg for the purpose of setting a voltage of Vneg, which is the output of the negative voltage boosting circuit 2, to the ground potential.

The drain CBL of the memory cell MC1 is connected to the read/write circuit 3, the source CSL of the memory cell is set to the ground potential GND by setting the N-type MOSFET MN2 to the conducting state at the time of reading or writing, and the source CSL of the memory cell is placed in the open state by setting the N-type MOSFET MN2. to the non-conducting state when an erase is performed.

Additionally, the substrate CWL of the memory cell MC1 is set to the ground potential GND by setting the N-type MOSFET MN4 to the conducting state at the time of reading or writing, and the substrate CWL of the memory cell is supplied with the output Ves of the positive voltage boosting circuit 4 when an erase is performed.

The N-type MOSFETs MN3, MN5, MN1, and MN7 are provided for the purpose of discharging the electrical charge on each one of the source CSL of the memory cell MC1, the substrate CWL, a drain CBL, and the gate WL.

As noted above, the erase operation for each memory cell MC1 of this flash memory is performed in unites of sectors, and because the capacity of the memory cells is large (512 Kbits), the parasitic capacitance is extremely large, so that to prevent a large amount of noise being generated at the ground potential GND when a sudden discharging is done, the N-type MOSFETs MN3, MN5, MN1, and MN7 are disposed so as to adjust the transistor capacity.

The erase operation in this flash memory is described. below, with references being made to the voltage waveform diagrams of FIG. 10 and FIG. 11.

FIG. 10 is a voltage waveform diagram showing the operation at the start of an erase operation.

At time T1, the signals CSG, CWG, CWP, and XDP all change from the high level to the low level, resulting in setting the N-type MOSFETs MN2, MN4, and MN6 to the non-conducting state and setting the P-type MOSFET MP1 to the conducting state.

After time T1, by the start of the operation of the positive voltage boosting circuit and the negative voltage boosting circuit the positive erase voltage Ves rises from Vcc up to, for example, 8 V, and the negative erase voltage Vneg rises from the ground potential GND to, for example, −8 V, whereupon the memory cell is subjected to an erase operation by the gate WL also changing to −8 V.

When this occurs, CSL and CBL, which are the source and drain of the memory cell, are in the open state, with the PN junctions between the substrate of the memory cell and the source and the drain forward biased, so that current flow into the source and drain from the substrate, the resulting voltage being approximately 7.4 V, which is approximately 0.6 V lower than the forward breakdown voltage of the PN junction.

FIG. 11 is a voltage waveform diagram showing the end of the erase operation.

Specifically, at time T3 the signal CWP changes from the low level to 8 V, which is the same as the Ves, so that the P-type MOSFET MP1 changes to the non-conducting state, thereby cutting off the current path between the positive erase voltage Ves and the substrate CWL of the memory cell.

The negative voltage boosting circuit stops operating at the time T3.

Simultaneously with the above, the signals DISP and DISN change from the low level to the high, level, resulting in the N-type MOSFETs MN1, MN3, MN5, and MN7 all going into the conducting state, which causes the negative voltage and positive voltage applied when erasing to discharge to the ground potential GND, and at time T4, at the time when the discharging has been completed, the operation of the positive voltage boosting circuit also stops, so that the positive erase voltage Ves stops the erase operation at Vcc.

In a flash memory of the past as described above, because the discharging of the various connection nodes (gate, source, drain, and substrate) of the memory cell at the completion of the erase operation is controlled separately, for example, it is extremely difficult to adjust the transistor capacity for each discharging, and various types of noise is generated.

For example, FIG. 12 shows an example in which the discharging capacity of the N-type MOSFETs MN7 to discharge the negative erase voltage Vneg is larger than that of the N-type MOSFETs MN1, MN3, and MN5.

The negative erase voltage Vneg transitions rapidly from −8 V to the ground potential GND at the time T3, this causing a shift of the ground potential GND within the memory cell in the negative voltage direction, leading to the possible blocking of the operation of the peripheral circuitry, and also because the negative erase voltage Vneg is capacitively coupled to the source, the substrate, and the drain of the memory cell via the gate capacitance of the memory cell, the potentials of the source, substrate, and drain of the memory cell are pulled upward, so that excessive stress is placed on the transistors connected to these nodes.

FIG. 13 shows an example in which the discharging capacities of the N-type MOSFETs MN1, MN3, and MN5 which discharge the positive high-voltage terminal are greater than that of the N-type MOSFET MN7, which discharges the negative erase voltage Vneg.

The substrate CWL, source CSL, and drain CBL which are at a high positive voltage suddenly transition from 8 V to the ground potential GND at the time T3, causing the ground potential GND within the semiconductor memory to change in the positive voltage direction, leading to possibility of blocking the operation of the peripheral circuitry. Additionally, according to the same principle as described with regard to FIG. 12, the negative erase voltage Vneg is pushed downward, so that excessive stress is placed on transistors connected to this node.

Additionally, although not shown in the drawings, in also the discharging of the source, substrate, and drain of memory cell, which are also raised to a high positive voltage, the alignment of the voltage changes when this discharging is performed is extremely difficult, requiring estimation of the parasitic capacitance at each node and adjustment of the transistor capacities for each discharge.

A cause of the above-noted problems is that, when electrical charges at various nodes in the memory cell (gate, source, drain, and substrate) at the time of erasing are discharged, the control of discharging at the various nodes is performed separately.

There is a method of performing erasing of a flash memory by applying positive and negative voltages to different nodes of a memory cell. For example, as disclosed in Japanese unexamined patent publication (KOKAI) No.6-275842, in a substrate erase method, a negative voltage is applied to a gate of a memory cell and a positive voltage is applied to the substrate part of the memory cell, to perform erasing, and in U.S. Pat. No. 5,077,691, there is. a gate-source erase method in which a negative voltage is applied to a gate of a memory cell and positive voltage is applied to a source of the memory cell.

For example, in recent 32-Mbit flash memories using the substrate erase method, using 512 Kbits as the unit for erasing, when an erase is performed a negative voltage is applied to all gates of memory cells for 512 Kbits, and a positive voltage is applied to the substrate to perform the erasing operation.

The negative voltage and positive voltage at the time of erasing are generated by a boosting circuit within the semiconductor memory and supplied to the memory cells. However, because the step-up capacity of the boosting circuit is not that great, there is a relative slow change in the voltage, taking from several microseconds to several tens of microseconds, occurs at the gates of the memory cells and the substrate at the start of the erase operation, and at the end of the erase operation the electrical charges accumulated on the gates of the memory cells and the substrate are discharged via a MOSFET to the ground potential, so that unless the MOSFET is designed properly there is the problem of losing operation of the internal circuitry due to a shift in the ground potential within the semiconductor memory.

That is, in an erasing operation of the past, the major concern was with regard to the discharging of a positive electrical charge. If discharging of a negative electrical charge is insufficient, however, the potential on the substrate tends to shift, this being accompanied by the danger that the substrate potential will be fixed at a negative voltage, in which case the operation of the flash memory itself is abnormal.

In the Japanese unexamined patent publication (KOKAI) No.10-214491, there is an erase method for a flash memory, in which the basic technical concept is that of a channel erase method, in which a negative voltage is applied to a gate and a positive voltage greater than Vcc is externally applied to the channel, along with the essential condition that source and drain of the memory cell are connected to the ground potential via a low-resistance current path. This reference, however, does not disclose a method of erasing, such as in the present invention, in which at least one of the gate part, the source part, the drain part, and the substrate is directly connected.

In Japanese unexamined patent publication (KOKAI) No.5-174588, there is disclosure of applying to the source and drain of a memory cell an electrical charge at or above the ground potential, and applying a negative potential below the ground potential to the gate in order to perform an erase operation. In Japanese unexamined patent publication (KOKAI) No.10-172293, there is an erasing method having a first erase mode with having a first step of setting the drain voltage of a memory cell to a voltage lower than the source voltage, a second step of setting the drain of the memory cell to the open state, and a third step of applying a positive voltage to the source of the memory cell, and a second erase mode having a fourth step of setting the gate of the memory cell to the ground potential and a fifth step of setting the source of the memory cell to the ground potential. That reference, however, does not disclose a method of erasing, such as in the present invention, in which at least one of the gate part, the source part, the drain part, and the substrate is directly connected.

Additionally, in Japanese unexamined patent publication (KOKAI) No.10-275484, there is a method of disposing a dummy memory cell at each memory cell, wherein when performing a write operation before applying a positive voltage to a gate the dummy memory cell is set to the on state to make the potential on the data line and the source line the same. That method, however, does not disclose a method of erasing, such as in the present invention, in which at least one of the gate part, the source part, the drain part, and the substrate is directly connected.

Accordingly, it is an object of the present invention to improve on the above-described drawbacks in the prior art, by providing a flash memory erase operation control method and flash memory erase operation controller which reliably causes surely discharging of a residual electrical charge in a memory cell in a short period of time, thereby eliminating faulty operation and enabling application to high-speed flash memories.

SUMMARY OF THE INVENTION

To achieve the above-noted objects, the present invention adopts. the following basic technical constitution.

Specifically, a first aspect of the present invention is a flash memory erase operation controller, which has a common discharging circuit part that makes a direct electrical connection between the gate part and at least one of the source part, the drain part, and the substrate part making up a memory cell, during the erase operation, and a second aspect of the present invention is a method for controlling an erase operation in a flash memory, whereby when performing an erase operation in a flash memory circuit, at least one of the source part, the drain part, and the substrate part making up a memory cell is directly connected electrically to the gate part during the erase operation.

By adopting the above-noted technical constitutions, a method for controlling an erase operation in a flash memory and a flash memory erase operation controller according to the present invention reliably discharge a residual electrical charge in a memory cell completely in a short period of time, thereby eliminating faulty operation and providing a method and controller for erase operation that is suitable for application to a high-speed flash memory.

Specifically, a basic technical feature of a method for controlling an erase operation in a flash memory and a flash memory erase operation controller according to the present invention is that a negative voltage (Vneg) applied to the gate of a memory cell, and the nodes of the source (CSL), the substrate (CWL), and the drain (CBL) are each connected to a common discharge node DISCOM, via the N-type MOSFETs MDN3 to MDN6, respectively, and further that an N-type MOSFET MDN7 is provided between the connection of the common discharge node DISCOM and the ground potential, so that the potentials at the various nodes of the memory cell are discharged via the common discharge node DISCOM.

DETAILED DESCRIPTION OF THE PREFERRED EMBODIMENTS

Embodiments of a method for controlling an erase operation in a flash memory and a flash memory erase operation controller according to the present invention are described in detail below, with references made to relevant accompanying drawings.

Figure 1:
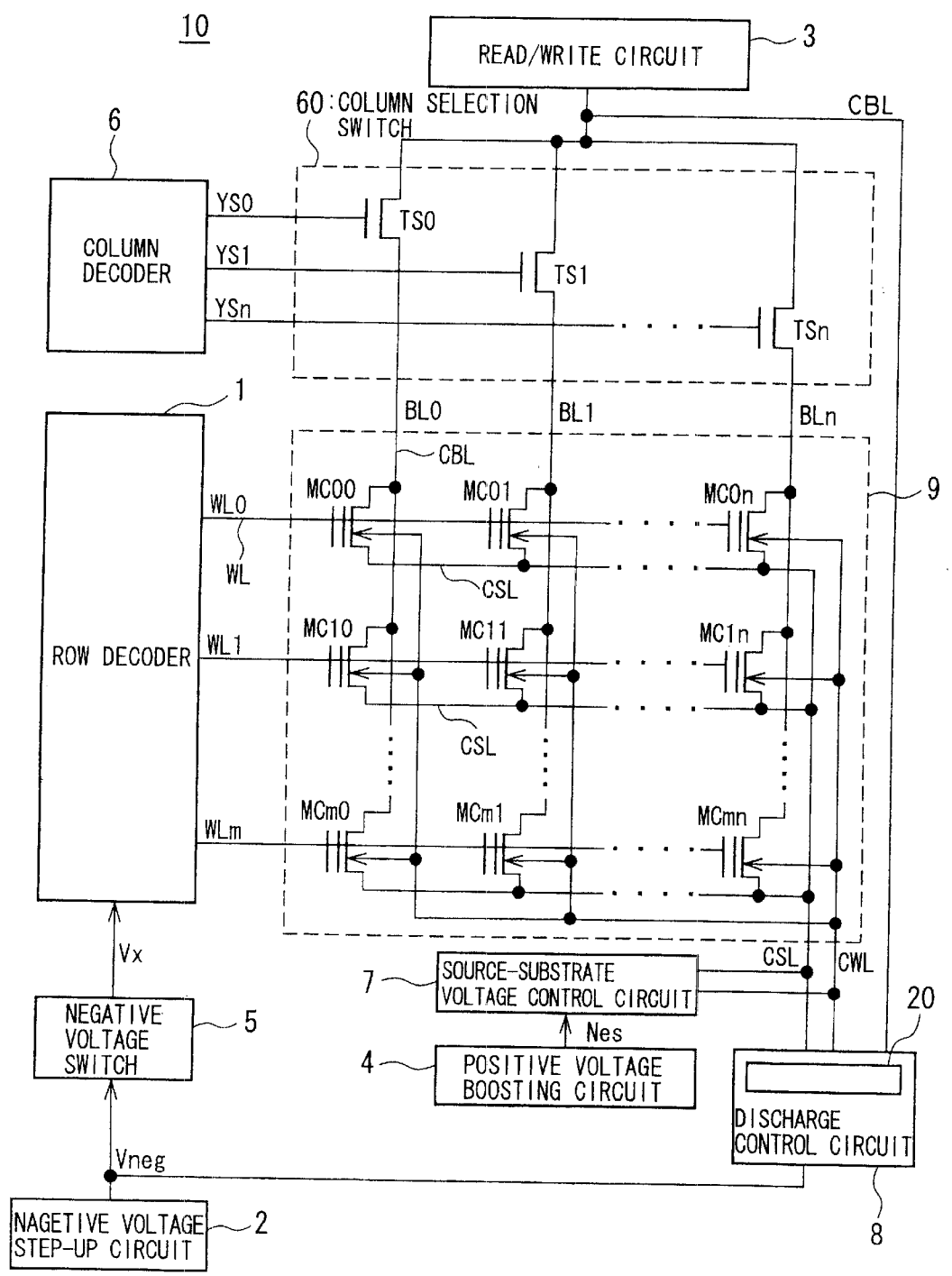
FIG. 1 is a block diagram showing an example of the configuration of a flash memory erase operation controller according to the present invention.
Figure 4:
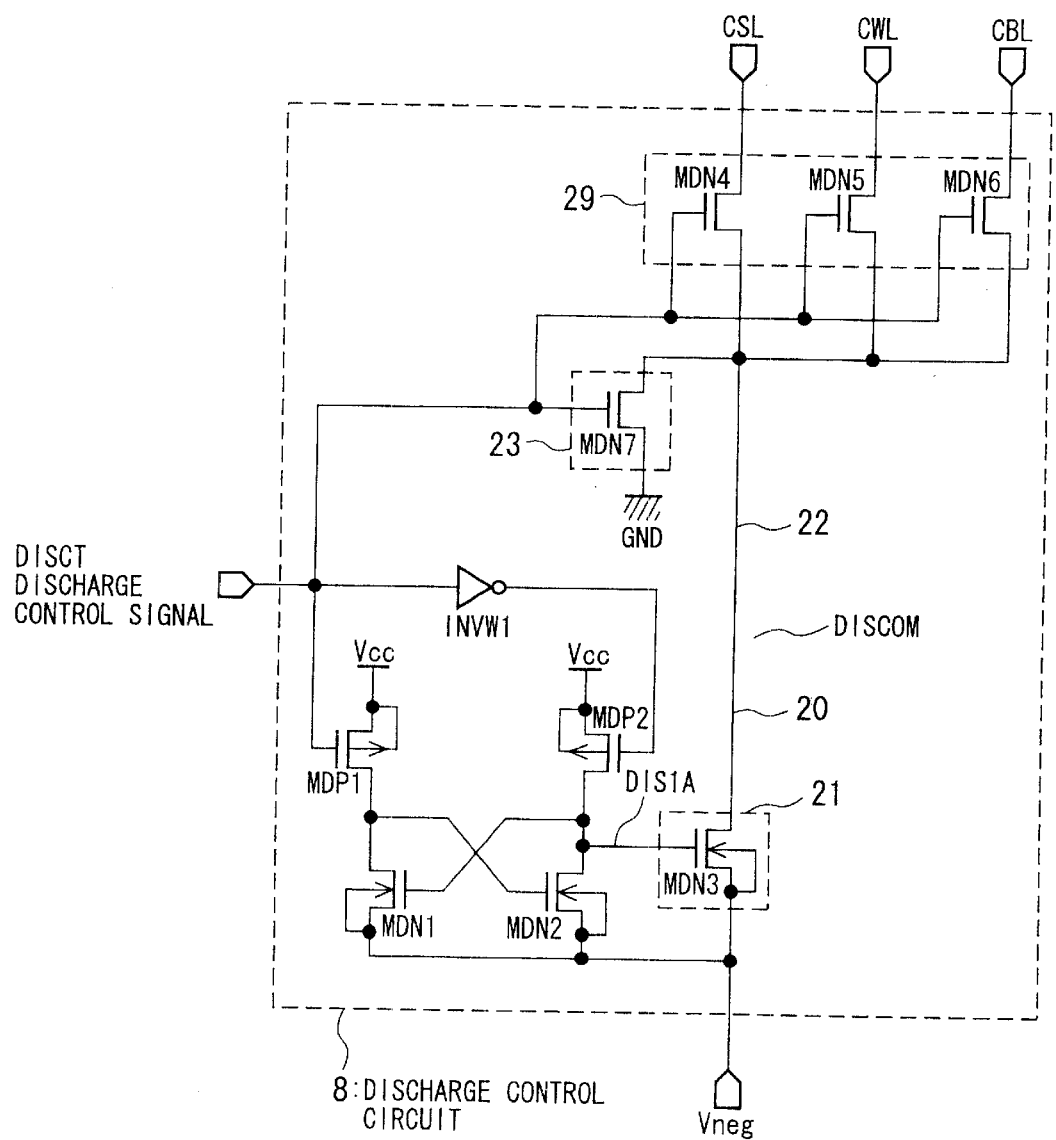
FIG. 4 is a block diagram showing an example of the configuration of a discharge control circuit in a flash memory erase operation controller according to the present invention.

Specifically, FIG. 1 and FIG. 4 are block diagrams showing an example of the configuration of a flash memory erase operation controller according to the present invention, which show a flash memory erase operation controller 10, which is formed by a common discharge circuit 20, which makes a direct electrical connection during an erase operation between at least one of the source part CSL, the drain part CBL, and the CWL part, which make up each of the cells MC00 through MCmn that form the cell array 9 of the flash memory circuit, and a gate part WL.

In the flash memory erase operation controller 10 according to the present invention, the common discharge circuit 20 is provided with a switch means 21, which causes conductivity in the common discharge circuit 20 during an erase operation, and makes an electrical connection between the gate part WL and at least one of the source part CSL, the drain part CBL and the substrate part CWL of the memory cell.

In the flash memory erase operation controller 10 according to the present invention, a positive voltage is applied to at least one of the source part CSL, the drain part CBL and the substrate part CWL, and a negative voltage is applied to the gate part WL.

That is, in the present invention it is desirable that a voltage that is always negative, for example, a voltage from −8 V to −9 V, be applied to the gate part, and that either a positive voltage be applied to at least one of the source part CSL, the drain part CBL and the substrate part CWL or one of these is left in the open state.

For example, in the case of the substrate erase method, if a negative voltage of −9 V is applied to the gate part WL, it is desirable that the voltage on the substrate part CWL be made +9 V, in which case both the source part CSL and the drain part CBL can be left in the open state, or have a positive voltage of, for example, +9 V applied thereto.

In the present invention, considering the case of source erasing, it is possible to set the gate part WL and the substrate part CWL to a voltage of 0 V, to set the source part CSL voltage to, for example, +9 V, and to leave the drain part CBL in the open state.

In the present invention, considering the case of gate-source erasing, it is possible to set the gate part WL to a negative voltage of −9 V, to set the substrate part CWL to a voltage of 0 V and also set the source part CSL to a voltage of +9 V, leaving the drain part CBL in the open state.

It will be understood that the configuration of the common discharge circuit 20 used in the flash memory erase operation controller 10 according to the present invention is not particularly restricted, and it is possible to use the circuit 20 having any configuration that has the function of electrically connecting formed between the gate part WL and at least one of the source part CSL, the drain part CBL, and the substrate part CWL of the memory cell, and the specific connection can be used as appropriate.

Additionally, the switch means 21 used in the common discharge circuit 20 of the present invention can be a transistor type of switch means using MOSFETs or the like.

In the specific example shown in FIG. 4, the switch means, which is a transistor type implemented by MOSFETs or the like, uses N-type MOSFETs, and the switch means 21 is disposed midway in the interconnect 22 forming the connection node (DISCOM) formed between the gate part WL and any one of the source part CSL, the drain part CBL, and the substrate part CWL.

In another example of the flash memory erase operation controller 10 according to the present invention, a ground voltage setting means 23 is provided so as to fix the potential of the common discharge circuit 20 reliably and quickly at the ground potential. The ground voltage setting means 23 is desirably provided between a ground part and the interconnection node (DISCOM) of the source part CSL, the drain part CBL, and the substrate part CWL of the common discharge circuit, and can be implemented using a switch means having a transistor such as an MOSFET or the like.

An another example of the flash memory erase operations controller 10 according to the present invention is described in further detail below, with references mad the drawing FIG. 1 to FIG. 4.

Figure 2:
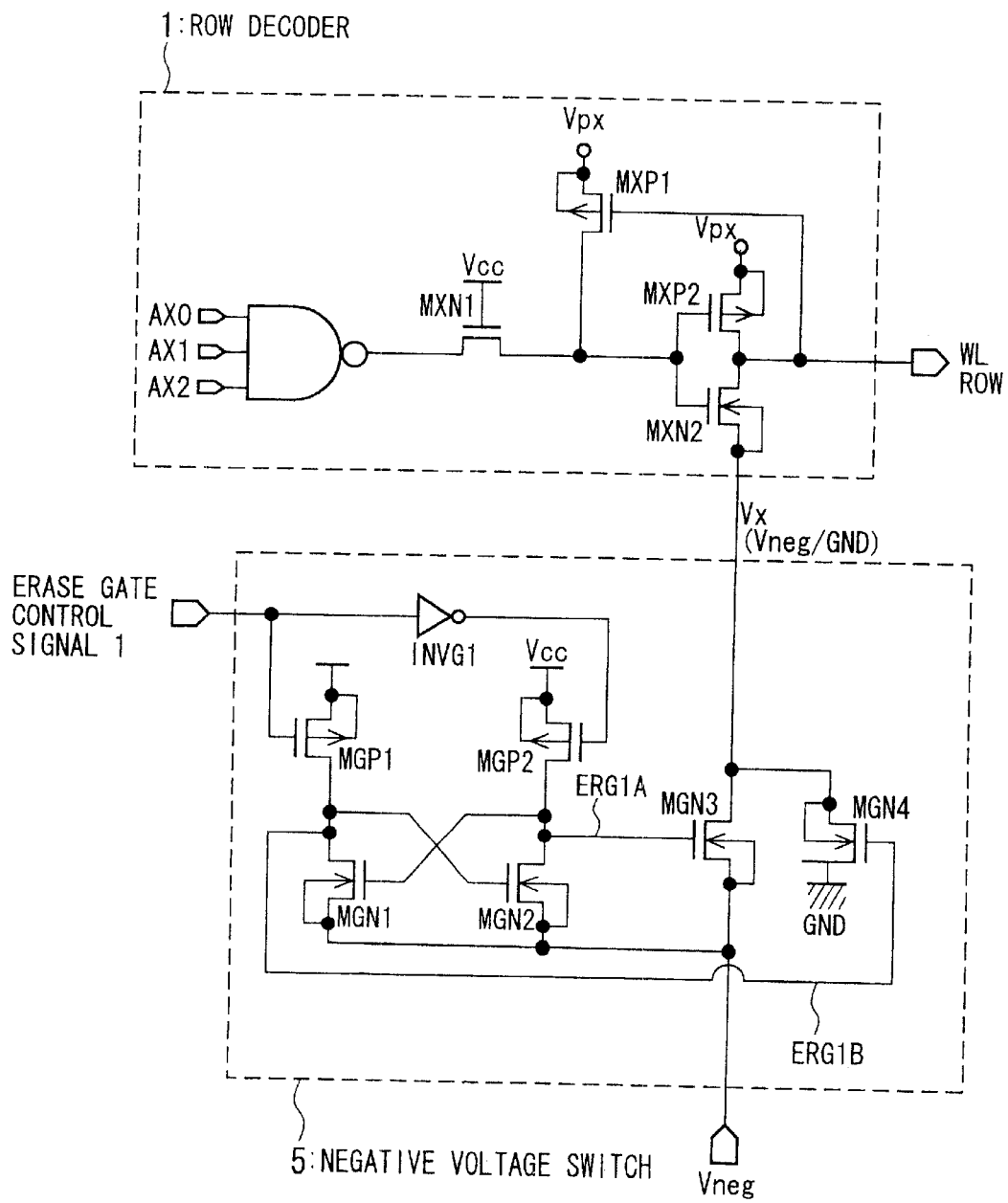
FIG. 2 is a block diagram showing an example of the configuration of a negative voltage switch and row decoder in a flash memory erase operation controller according to the present invention.

Specifically, FIG. 1 is a block diagram illustrating the general configuration of an example of the flash memory erase operation controller 10 according to the present invention, this flash memory erase operation controller 10 having a row decoder 1, which is connected to the gates WL of each memory cell in a memory array 9 made up by a plurality of cell groups MC00 to MCmn and which selects a prescribed column, via a prescribed column selection switch, a write circuit 3 connected to each column, which performs writing, a negative voltage switch connected to the row decoder 1, a negative voltage boosting circuit 2 connected to the negative voltage switch 5, a source-substrate voltage control circuit 7 connected to the source CSL of each memory cell and the substrate CWL, a positive voltage boosting circuit 4 connected to the source-substrate voltage control circuit 7, and a discharge control circuit 8 connected to the negative voltage boosting circuit 2 and also connected in common to the drain CBL, the source CSL and the substrate CWL of each memory cell. FIG. 2 is a circuit block diagram showing one example of the negative voltage switch 5 and the row decoder 1 shown in FIG. 1.

Figure 3:
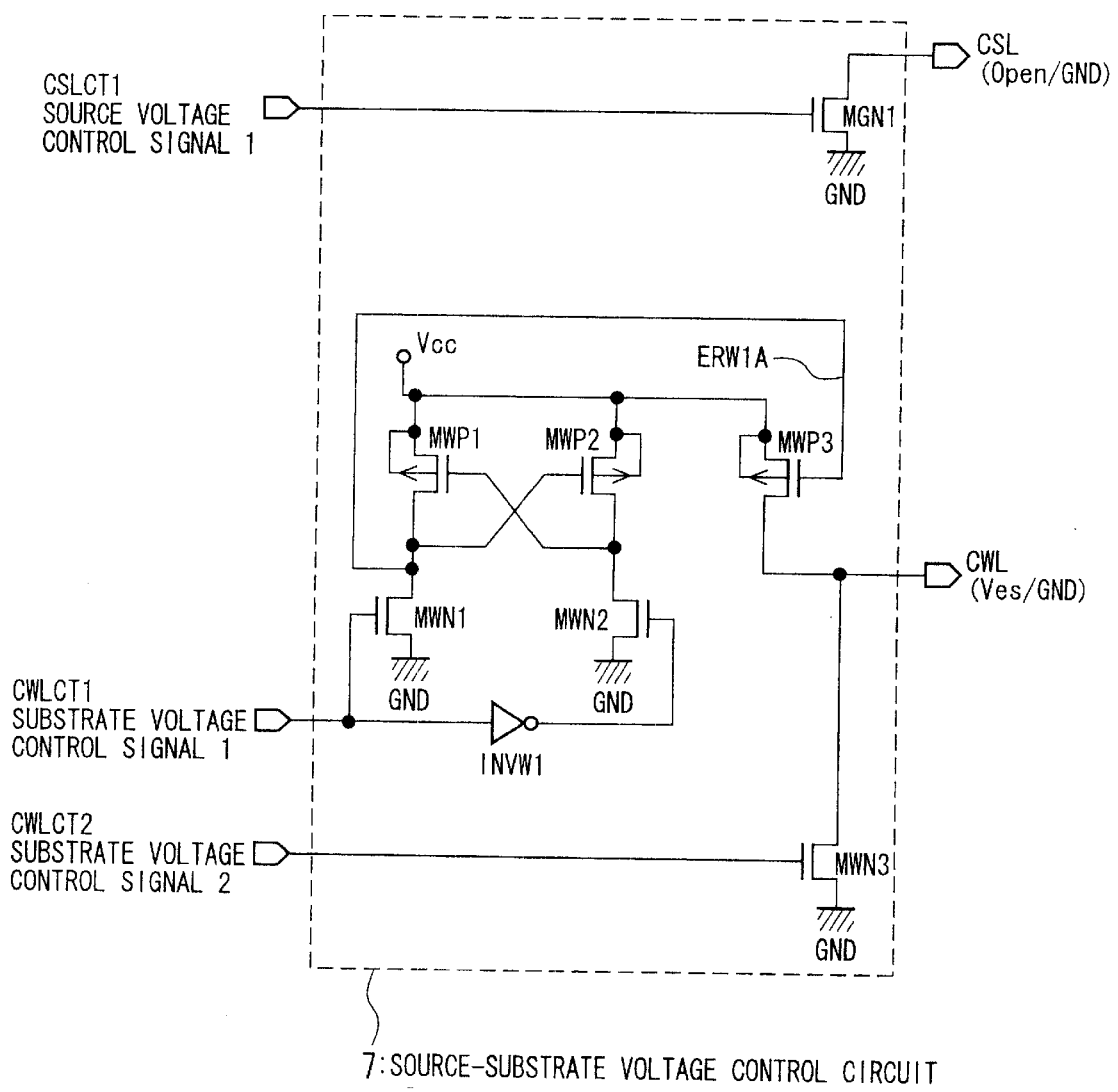
FIG. 3 is a block diagram showing an example of the configuration of a source-substrate voltage control circuit in a flash memory erase operation controller according to the present invention.

FIG. 3 is a block diagram showing one example of the configuration of the source-substrate voltage control circuit 7 shown in FIG. 1, and FIG. 4 is a block diagram showing one example of the configuration of the discharge control circuit 8 shown in FIG. 1.

In the embodiment shown in FIG. 1, MC00 and MC01 to MCmn are disposed in a matrix arrangement, the gates of each of the memory cells being connected to the row lines WL1, WL1, WLm and the drains being connected to the column lines BL, BL1, BLn.

The row lines WL0, WL1, WLm are selectively controlled by the row decoder 1, and the column lines BL0, BL1, BLn are selectively read out as the common column CBL1, via the column decoder 6 and a column selection switch 60, and connected to the write circuit 3.

The substrate and sources of the memory cells MC00 and MC01 to MCmn are each connected in common to the substrate potential. CWL and the source potential CSL.

The row decoder 1 shown in FIG. 2 controls the row line WL, and when data is read or written, supplies a positive voltage Vpx to the selected row line WL, and when data is erased supplies a negative voltage Vneg to the node Vx via the negative voltage switch, thereby supplying the. negative voltage Vneg to the row line WL.

The negative voltage switch 5 is configured so as to set the N-type MOSFET MGN3 to the non-conducting state the N-type MOSFET MGN4 to the conducting state when data is read or written, and so as to set the N-type MOSFET MGN3 to the conducting state and the N-type MOSFET MGN4 to the non-conducting state when data is erased, so that the erasing negative voltage Vneg is supplied to the node Vx.

The source-substrate voltage control circuit 7 shown in FIG. 3 sets the P-type MOSFET MWP3 to the non-conducting state and the N-type MOSFETs MSN1 and MWN3 to the conducting state when data is read or written, thereby setting the source potential CSL of the memory cell and the substrate potential CWL to the ground potential GND, and sets the P-type MOSFET MWP3 to the conducting state and the n-type MOSFETs MWN1 and MWN3 to the non-conducting state when data is erased, thereby setting the source potential CSL of the memory cell to the open condition and the substrate potential CWL to the erasing positive voltage Ves, via the P-type MOSFET MWP3.

The discharge control circuit 8 shown in FIG. 4 operates when the positive and negative voltages applied to the memory cell for which the erasing is to be completed are discharged, and at the time of this discharging, sets the N-type MOSFETs MDN3, and MDN4 to MDN6 to the conducting state, so as to connect CSL, CWL, CBL, and Vneg, which are electrically connected to the source, substrate, drain, and gate nodes of the memory cell to. the common discharge circuit 20 formed by the common discharge node DISCOM, and sets the N-type MOSFET MDN7 to the conducting state so that the common discharge circuit 20 formed by the common discharge node DISCOM is ultimately set to the ground potential GND, thereby setting each node of the memory cell to GND, completing the discharging.

The N-type MOSFET used in FIG. 4 functions as a switch means, and the N-type MOSFET MDN3 is a switch means 21 that electrically connects or breaks the connection between the gate, to which a negative potential is applied, and the common discharge circuit 20 (DISCOM). The N-type MOSFETs MDN4 to MDN6 are a switch means 29 that electrically connects or breaks the connection between the source CSL of the cell, the substrate CWL, and the drain CBL of the cell and the common discharge circuit 20 (DISCOM).

The N-type MOSFET MDN7 is a switch means 23 provided for the purpose of making or breaking an electrical connection between the common discharge circuit 20 (DISCOM) and the ground potential power supply.

The control signals used in FIG. 1 to FIG. 4 are, for example, an erase gate control signal ERG1, a source voltage control signal CSLCT1, a substrate voltage control signal 1CWLCT1, a substrate voltage control signal 2CWLCT2, and a discharge control signal DISCT and the like, an appropriate circuit responding to a prescribed control program so as to generate the signals at the prescribed timing.

An example of the operation procedure in a method for controlling erasing in a flash memory using the flash memory erase operation controller according to the present invention described above is described below, with references being made to FIG. 5 and FIG. 6.

Figure 5:
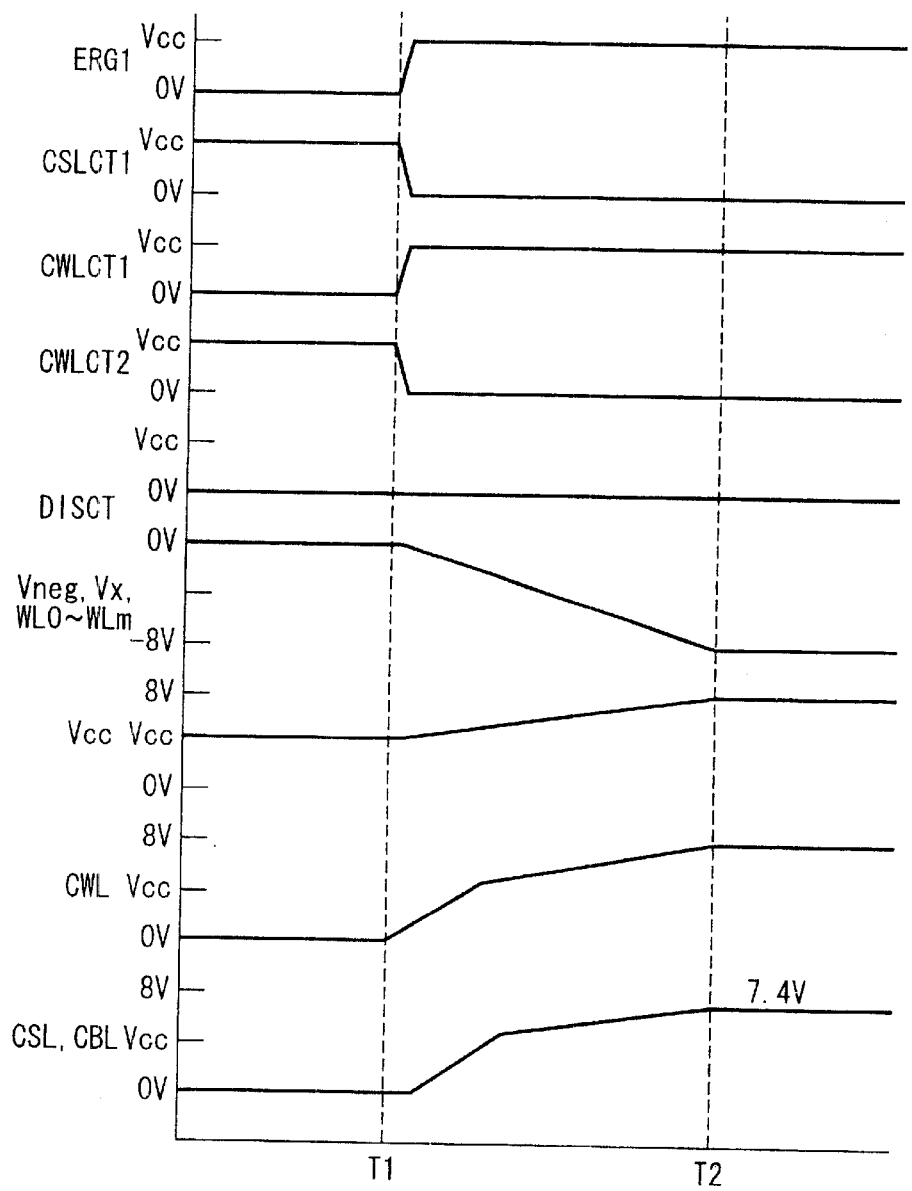
FIG. 5 is a waveform diagram illustrating an erase operation occurring in a flash memory erase operation controller according to the present invention.

Specifically, FIG. 5 is a voltage waveform diagram showing the operation at the start of an erase operation for the case in which a flash memory erase operation controller 10 according to the present invention is used.

That is, at time T1 the erase gate control signal ERG1 changes from the low level to the high level, the gate voltage ERG1B of the N-type MOSFET MGN4 within the negative voltage switch 5 of FIG. 2 changing to the same potential as the erase negative voltage Vneg, thereby placing the device in the non-conducting state, the gate voltage ERG1A of the N-type MOSFET MGN3 changing to Vcc, so that the device is placed in the conducting state, and the erase negative voltage Vneg being supplied to the supply path to the row line WL, via the N-type MOSFET MGN3 in the negative voltage switch and the N-type MOSFET MXN2 within the row decoder.

At this same time T1, the source voltage control signal CSLCT1 changes from the high level to the low level, so that the N-type MOSFET MSN1 within the source-substrate voltage control circuit 7 goes into the non-conducting state, placing the source CSL of the memory cell in the open condition, the substrate voltage control signal CWLCT1 changes from the low level to the high level, so that the substrate voltage control signal CWLCT2 changes from the high level to the low level, resulting in the P-type MOSFET MWP3 within the source-drain voltage control circuit 7 going into the conducting state and the N-type MOSFET MWN3 going into the non-conducting state, thereby establishing a supply path for the positive erase voltage Ves to the substrate CWL of the memory cell via the P-type MOSFET MWP3 within the source-drain voltage control circuit 7.

Additionally, the discharge control signal DISCT which is input to the discharge control circuit 8 of FIG. 4 remains at the low level, and the N-type MOSFETs MDN3 and MDN4 to MDN7 within the discharge control circuit 8 are all in the non-conducting state.

After the time T1, when operation of the positive voltage boosting circuit and the negative voltage boosting circuit begins, the positive erase voltage Ves rises from Bcc to, for example, 8 V, whereupon the substrate CWL of the memory cell also rises to 8 V, the negative erase voltage Vneg rises from the ground level GND to, for example, −8 V, at which point the gates WL0 to WLm of the memory cells also change up to −8 V, thereby erasing the memory cells.

When this occurs, the CSL and CBL, which are the source and drain of the memory cells are in the open condition, and the substrate CWL, the source CSL, and the drain CBL PN junctions of the memory cell are forward biased, so that a current flows from the substrate CWL into the source CSL and the drain CBL, this exhibiting a voltage that is approximately 7.4 V, which is approximately 0.6 V lower than the forward breakdown voltage of the PN junction.

Figure 6:
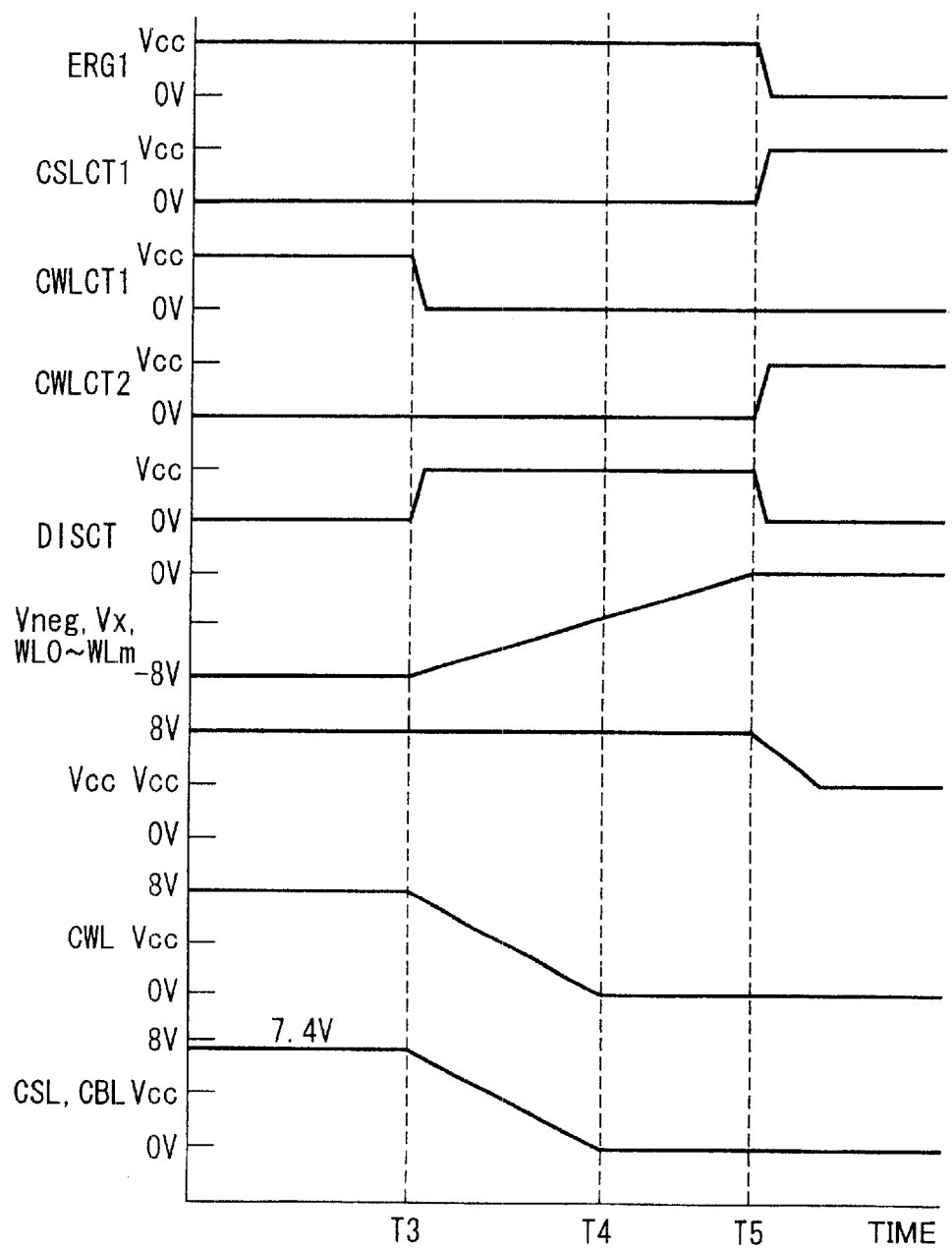
FIG. 6 is a waveform diagram illustrating an erase operation occurring in a flash memory erase operation controller according to the present invention.

FIG. 6 is a voltage waveform diagram showing end of the erasing operation in the method of flash memory erasing control according to the present invention.

Specifically, at time T3 the substrate voltage control signal CWLCT1 changes from the high level to the low level, so that the P-type MOSFET MWP3 within the source-substrate voltage control circuit 7 goes into the non-conducting state, thereby cutting off the current path between the positive erase voltage Ves and the memory cell.

At this same time T3, the negative voltage boosting circuit 2 stops operating.

Simultaneously with the above, by the action of the discharge control signal DISCT changing from the low level to the high level, the N-type MOSFETs MDN3, MDN4, MDN5, and MDN6 within the discharge control circuit 8 are placed in the conducting state, so that CSL, CWL, CBL, and Vneg, which are electrically connected to the nodes of the source, substrate, drain, and gate of the memory cell, are connected to the common discharge node DISCOM, and further the N-type MOSFET MDN7 goes into the conducting state, so that a current path is established between the common discharge node DISCOM and the ground potential GND.

Although not shown in this drawing, with all the column decoders YS0 to YSn at the high level, all the N-type transistors TS0 to TSn of the column selection switch are in the conducting state, so that a current path is established from the column lines BL0 to BLn, to which the drains of the memory cells are connected to the node CBL.

During the period from time T3 to time T4, the positive electrical charge at CSL, CWL, and CBL, which were at a high positive voltage, is transferred to the common discharge node DISCOM via the N-type MOSFETs MDN4, MDN5, and MDN6 within the discharge control circuit, and further this is discharged to negative erase voltage Vneg and to the ground potential GND via the N-type MOSFETs MDN3 and MDN7 from the common discharge node DISCOM.

With the discharge of the positive electrical charge from the common discharge node DISCOM, the negative erase voltage Vneg changes from −8 V in the direction of the ground potential GND, so that the negative voltage on the gates WL0 to WLm of the memory cells also are discharged, via the negative voltage switch and the row decoder.

At the time T4, when CSL, CWL, and CBL are discharged to the ground potential GND, the residual negative voltage of the negative erase voltage Vneg is discharged to the ground potential GND via the N-type MOSFET MDN3 and MDN7 within the discharge control circuit, and at the time T5, the final negative erase voltage Vneg and the gates WL0 to WLm of the memory cells are set to the ground potential GND, after which the erase gate signal ERG1 changes from the high level to the low level, the source voltage control signal CSLCT1 changes from the low level to the high level, the substrate voltage control signal CWLCT2 changes from the low level to the high level, and the discharge control signal DISCT changes from the high level to the low level, so that the positive voltage boosting circuit operation also stops, and the positive erase voltage Ves is changed to Vcc, resulting in the end of the erase operation.

As is clear from the above description, in the present invention during the times T1 and T2 shown in FIG. 5, operation is performed so as to prepare for the erase operation in the flash memory.

As one example of the preparation operation for the erase operation, the steps executed are a first step of leaving the source-drain potentials of transistors forming each cell making up the memory cell array open, a second step of changing the substrate potential from 0 V to an applied positive voltage of, for example, 9 V, and a third step of changing the transistor gate voltage to an applied negative voltage of, for example, −9 V.

After the above is performed, during the time period between time T2 and the time 3, which is shown in FIG. 6, the erase operation is executed, after which during the time period between time T3 and time T4, an operation is performed so as to end the erase operation.

An example of the operation for ending the erase operation executes a fourth step of first leaving the substrate voltage CWL open, and a fifth step of causing conduction in the switches 21 and 23, and if necessary 29, so that connection is made between the substrate, the source, the drain, and the gain, via the common discharge circuit 20, so as to execute the discharge operation.

Finally, at time T5 the erase operation is ended.

Another example of the flash memory erase operation controller 10 according to the present invention is described in detail below, with reference made to FIG. 7.

Specifically, a flash memory is generally divided into erase units (hereinafter referred to as sectors) comprising a plurality of memory cells, with erasing performed sector units.

For example, in the case of a 32-Mbit flash memory, if division is made into 512-Kbit sectors, there will be 64 sectors.

Additionally, in order to improve the performance of a flash memory in a system, there are products in existence in which it is possible during the erasing of a given sector to read data from another sector.

Figure 7:
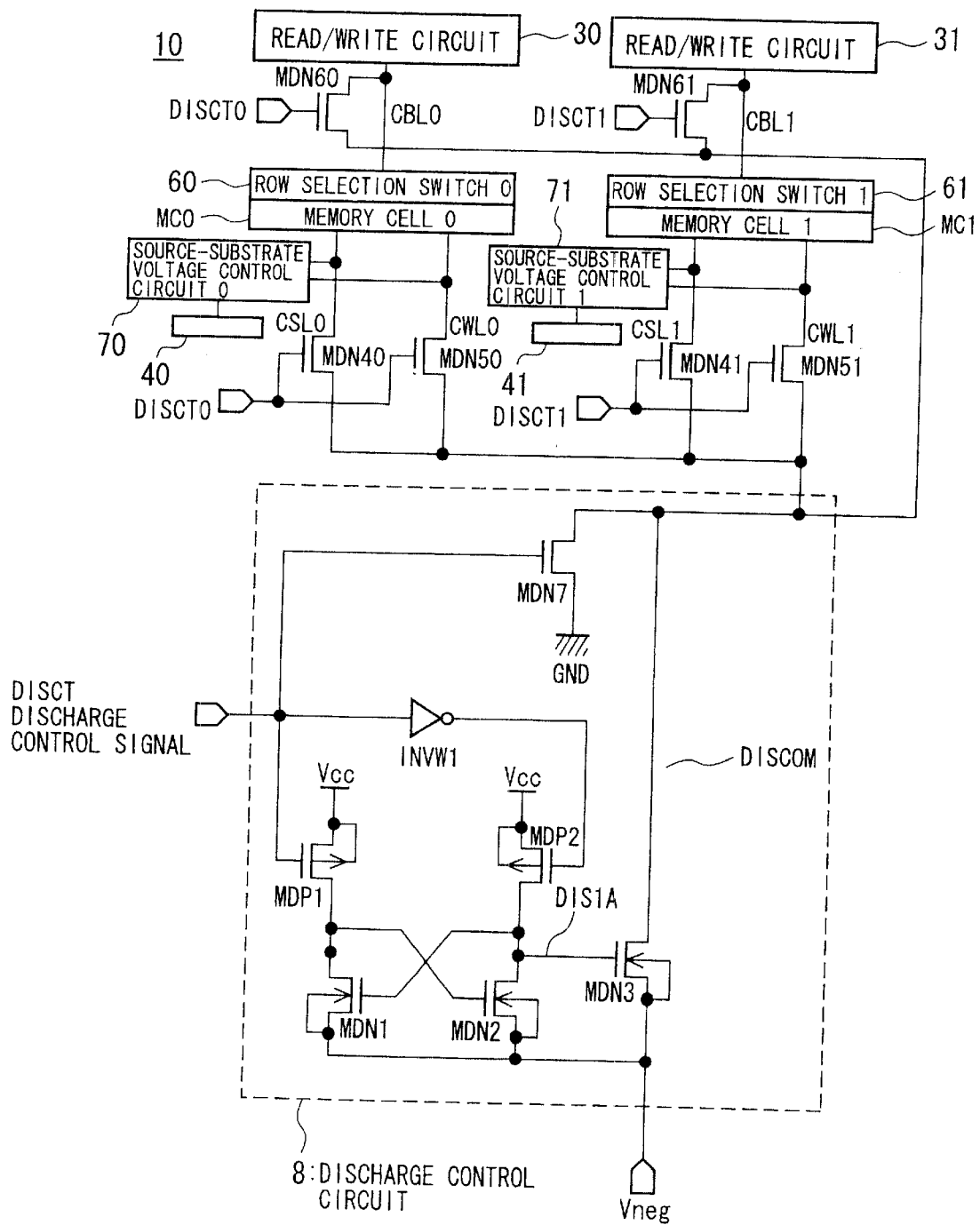
FIG. 7 is a block diagram showing another example of a flash memory erase operation controller according to the present invention.

FIG. 7 is a circuit diagram of another embodiment in which the present invention is applied to a flash memory.

In FIG. 7, there are two sectors, memory array 0 and memory array 1, the source CSL0, substrate CWL0, and drain CBL0 of the memory array 0 being connected to the common discharge circuit 20, which is the common discharge node DISCOM, via the N-type MOSFETs MDN40, MDN50, and MDN60, respectively, and the source CSL1, substrate CWL1, and drain CBL1 of the memory array 1 being connected to the common discharge circuit 20, which is the common discharge node DISCOM, via the N-type MOSFETs MDN41, MDN51, and MDN61, respectively.

In this case, in the case, for example, of reading out data from the memory array 1 during the erasing of the memory array 0, the discharge control signal DISCT1 for the memory array 1 is always at the low level, and the N-type MOSFETs MDN41, MDN51, and MDN61 are in the non-conducting state, the source-substrate voltage control circuit 7 supplying the source CSL1 and the substrate CWL1 of the memory array 1 with the ground potential GND, so that the memory array 1 is separated from the common discharge node DISCOM, enabling readout of data from that memory cell.

In the case in which the memory array 0 is erased, when the electrical charge of the memory array 0 is discharged at the end of the erase operation, at the same timing as indicated for the discharge control signal DISCT in the waveform diagram of FIG. 6, the discharge control signal DISCT0 for the memory array 0 is caused to change, so that the discharging is done at the end of the erase operation, in the same manner as occurring in the previously described embodiment of the present invention.

A feature of the present invention is the method of performing a discharge of the electrical charge on the memory cell at the end of the erase operation, via the common discharge circuit 20 formed by the common discharge node DISCOM, and the adoption of this feature means that even in a flash memory divided into a plurality of sectors, by merely providing an N-type MOSFET device between the source, substrate, and drain of the memory array for each sector, there is no accompanying increase in the chip size, circuit complexity, and control complexity in a semiconductor memory.

That is, in the example of the present invention as shown in FIG. 7, a flash memory is divided into a plurality of cell groups MC00 to MCmn making up a memory array 9 of the flash memory circuit, for example into 2 groups (group 0 and group 1), and flash memory erase operation controllers 10 such as noted above are provided separately for each of the groups, so that it is possible to execute an erase operation for each of the groups separately.

Specifically, in this embodiment of the present invention, for example, it is possible to have a configuration in which the erase operation of a memory array in units of sectors, where a sectors has 64 Kbytes (512 Kbits) and, as shown in FIG. 7, reading/writing circuits 30 and 31, discharge control signal DISCT input terminals (DISCT0 and DISCT1), row switches 60 and 61, memory cell arrays MC0 and MC1, and source-substrate voltage control circuits 70 and 71 are provided separately for each sector, one discharge control circuit 8 being provided in common for the plurality of sectors.

Figure 8:
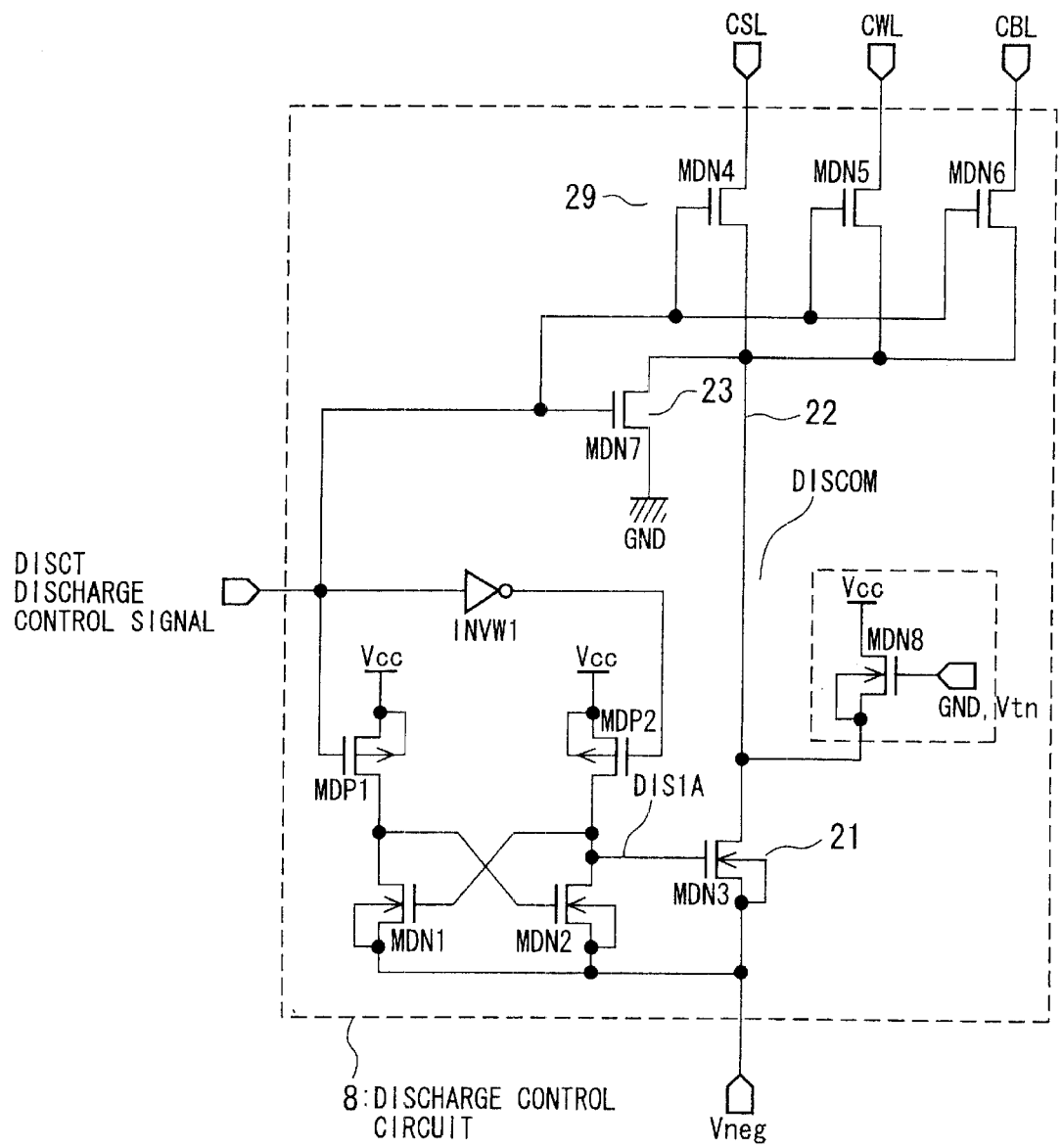
FIG. 8 is a block diagram showing an example of the configuration of yet another example of a flash memory erase operation controller according to the present invention.
Figure 9:
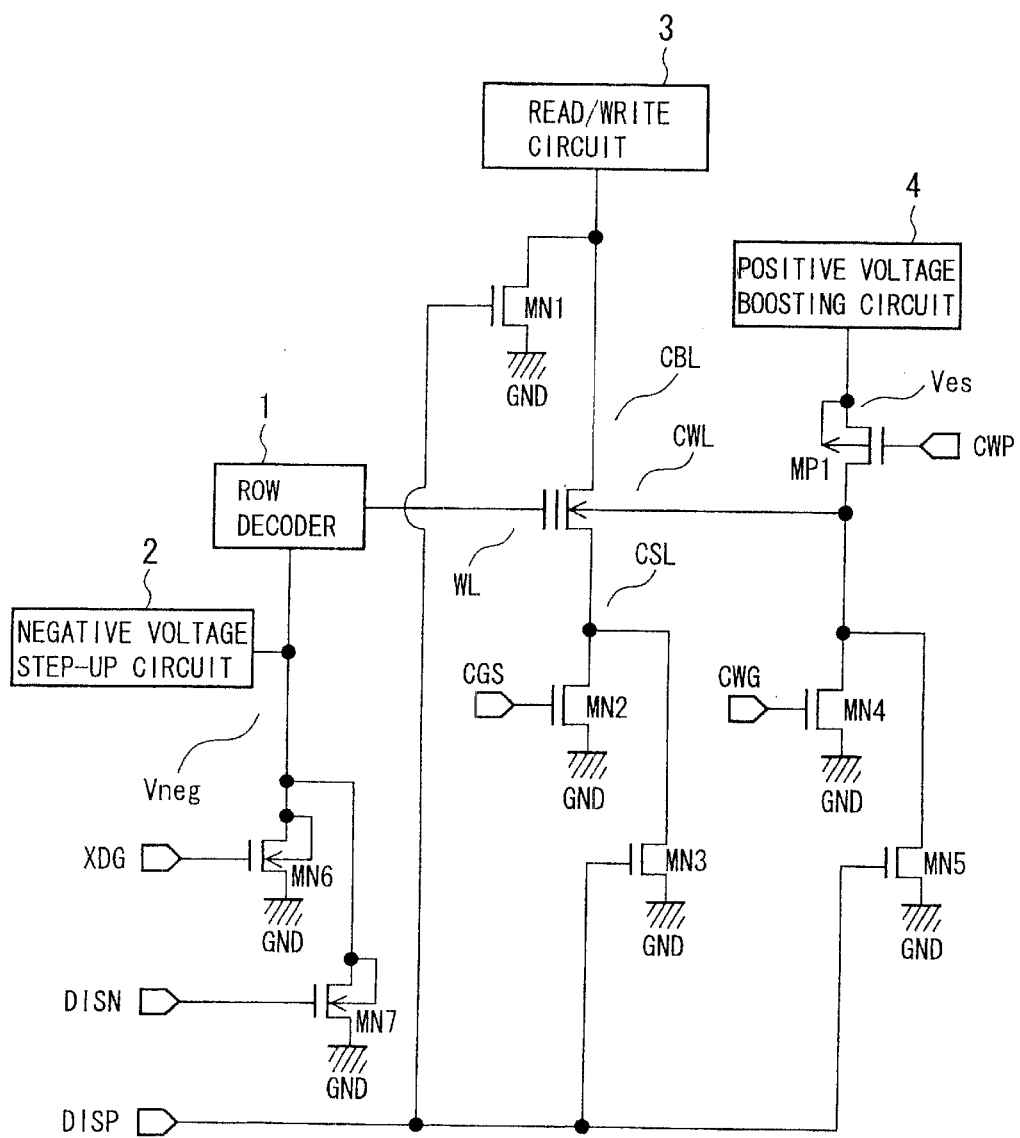
FIG. 9 is a block diagram showing an example of the configuration of an example of a flash memory erase operation controller of the past.
Figure 10:
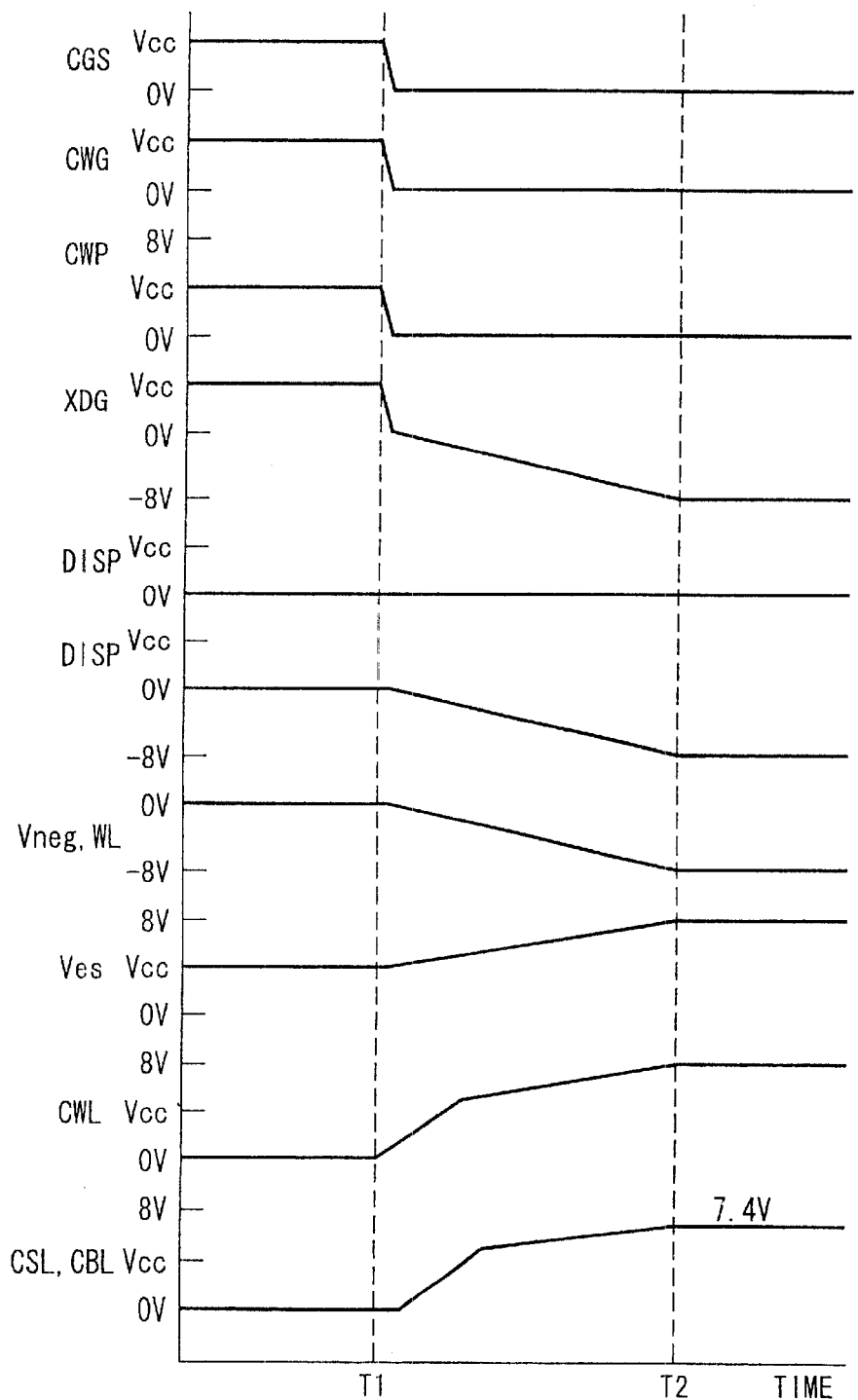
FIG. 10 is a waveform diagram illustrating an erase operation occurring in a flash memory erase operation controller of the past.
Figure 11:
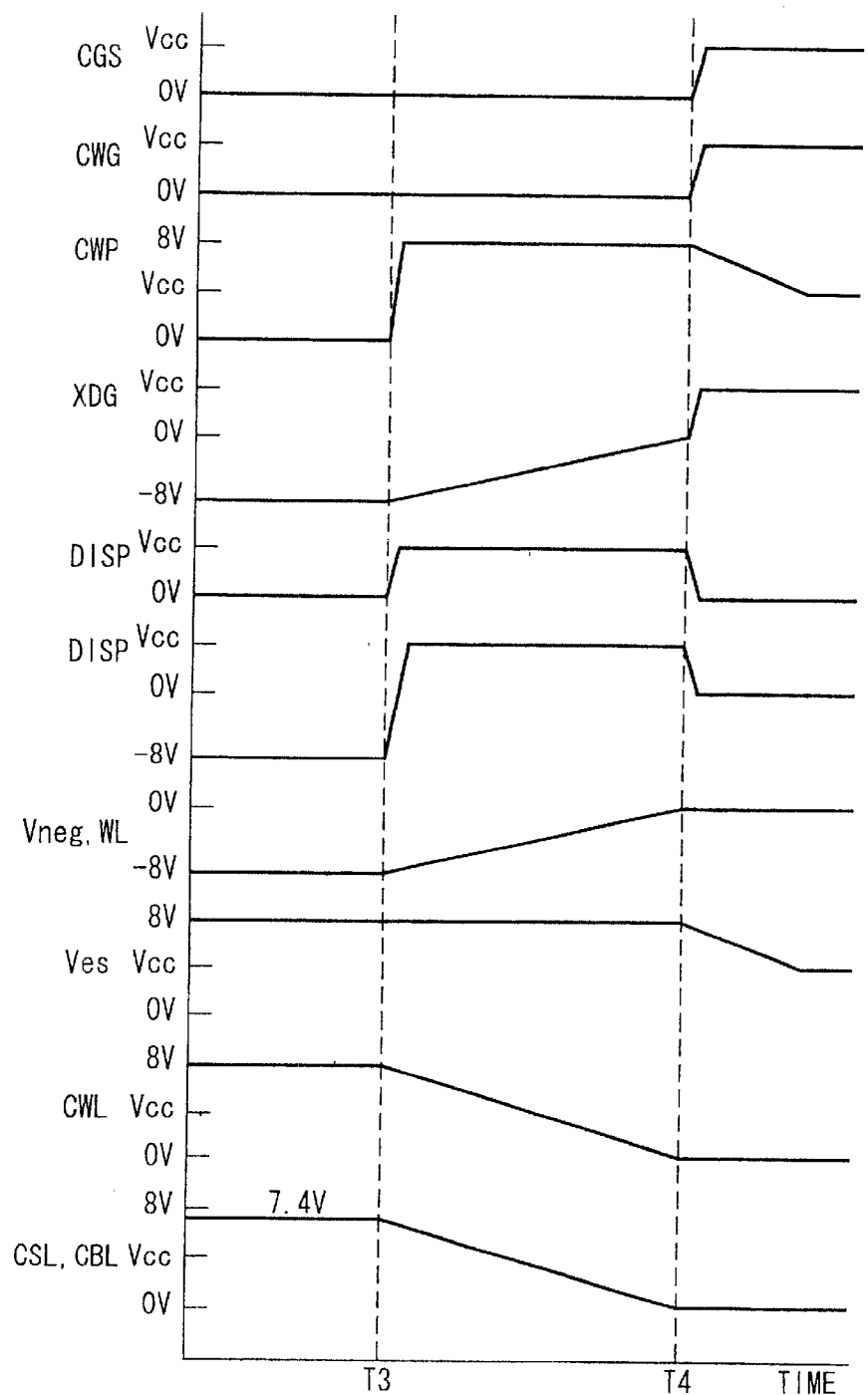
FIG. 11 is a waveform diagram illustrating an erase operation occurring in a flash memory erase operation controller of the past.
Figure 12:
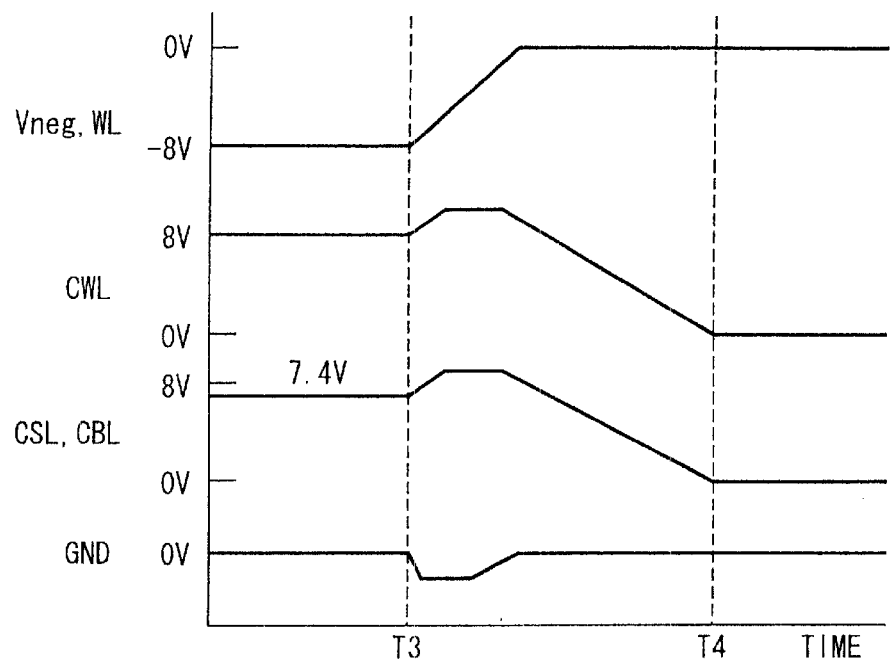
FIG. 12 is a waveform diagram illustrating a problem in a flash memory erase operation controller of the past.
Figure 13:
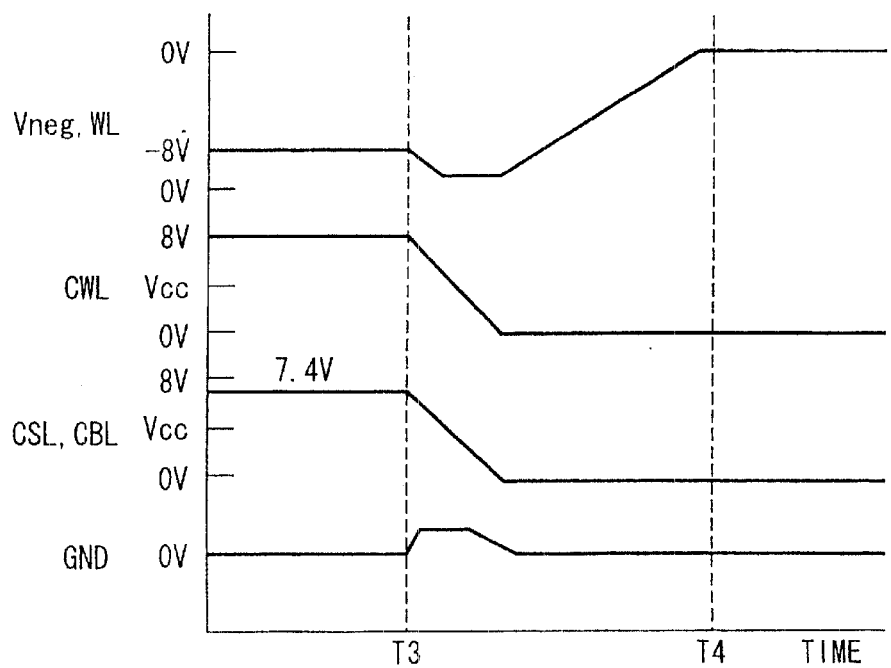
FIG. 13 is a waveform diagram illustrating a problem in a flash memory erase operation controller of the past.
Figure 14:
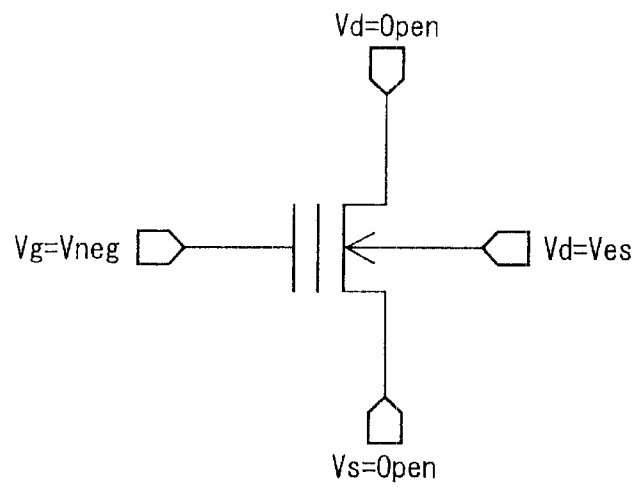
FIG. 14 is a block diagram showing an example of the structure of a flash memory to which a substrate erase method of the past has been applied.
Figure 15:
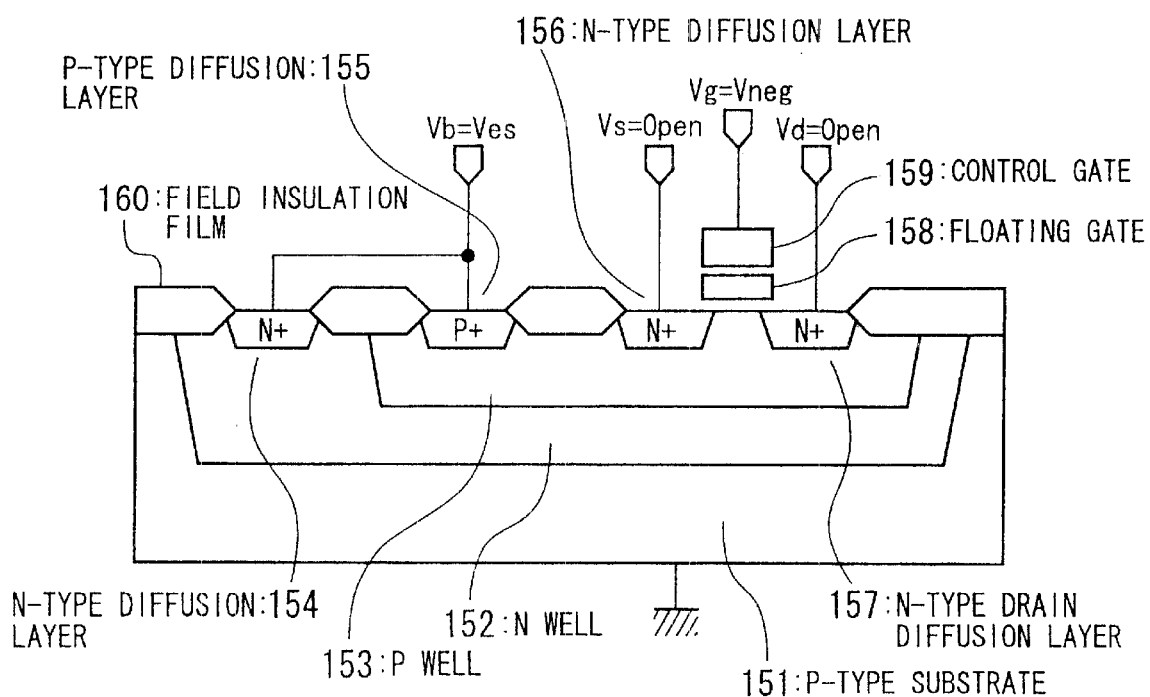
FIG. 15 is a block diagram showing an example of the structure of a flash memory to which a substrate erase method of the past has been applied.

FIG. 8 is a circuit diagram showing another embodiment of the discharge control circuit 8 according to the present invention.

In the present invention, because Vneg, CSL, CWL, and CBL, which are electrically connected to the source, substrate, drain, and gate nodes of the memory cell are connected to common discharge node DISCOM, via the N-type MOSFETs MDN3, MDN4, MDN4, MDN5, and MDN6, and because the common discharge node DISCOM is connected to the ground potential GND via the N-type MOSFET MDN7, even if the amount of electrical charge for the high positive voltage high negative voltage when erasing is completed are the equal, because there is a path via which the high positive voltage charge discharges to the high negative voltage via the N-type MOSFET MDN3 and a path via which discharging is done to the ground potential GND via the N-type MOSFET MDN7, as shown in FIG. 6 the high positive voltage is first discharged to the ground potential GND at time T4, after which at time T5 the high positive voltage is discharged to the ground potential GND.

During the period from time T4 to time T5, the high negative voltage Vneg is discharged to the ground potential GND via the N-type MOSFET MDN3, so that there are cases in which the common discharge node DISCOM has a negative voltage, so that there is a further risk that of influence on the source, substrate, and drain of the memory cell via the N-type MOSFETs MDN4, MDN5, and MDN6.

In this embodiment, an N-type MOSFET MDN8 is provided between the common discharge node DISCOM and the power supply voltage Vcc, so that the associated gate is set to the ground potential GND.

By providing this N-type MOSFET MDN8, the common discharge node DISCOM is set to a negative voltage, and if the absolute value of this voltage exceeds the threshold voltage of the N-type MOSFET MDN8, because the gate-source potential of the N-type MOSFET MDN8 is greater than the threshold voltage, the device goes into the conducting state, so that current flows into the common discharge node DISCOM from the power supply voltage Vcc, thereby causing the common discharge node DISCOM to greatly shift in the negative voltage direction.

If a voltage is supplied to the gate of the N-type MOSFET MDN8 that is nearly the same as the threshold voltage Vtn thereof, when the common discharge node DISCOM reaches a negative voltage that is lower than the ground potential GND, the N-type MOSFET MDN8 goes into the conducting state, so that the common discharge node DISCOM is prevented from transitioning in the negative voltage direction.

Although the above has been a description of an embodiment of the present invention with regard to a substrate erase method, the only change there would be to apply the present invention to a gate-source erase method is that the part to which the positive voltage is applied is changed from the substrate to the source.

That is, in a flash memory erase operation controller 10 according to the present invention, because one terminal of the common discharge circuit 20 is connected to a negative potential, depending upon the circumstances, there is a risk that the potential on the common discharge circuit 20 is not fixed to the ground potential GND, but rather is fixed to a negative potential.

As a result, because the substrate potential changes, and there is a risk that the operation of the flash memory itself will be adversely affected, in another embodiment of the present invention, as shown in FIG. 8, it is desirable that a ground potential fixing means 25 be provided for the purpose of preventing the situation in which the voltage on a part of the common discharge circuit 20.

The ground potential fixing means 25 can generally be implemented using a transistor such as a MOSFET or the like, in which case it is desirable that the gate of the MOSFET be set to the ground potential.

As is clear from the foregoing description, in an example of a method for controlling an erase operation using a flash memory erase operation controller 10 according to the present invention, when performing an erase operation in the flash memory circuit, at least one of the sources, drains, and substrate making up the memory cells is directly electrically connected to the gate during an erase operation in the flash memory, and in this flash memory erase operation control method at least one of the source, the drain and the substrate has a positive voltage applied to it during the erase operation, the gate having a negative voltage applied to it to execute this method of flash memory erase operation control.

Additionally, in a flash memory erase operation control method according to the present invention it is desirable that a common discharge circuit function so that at least one of the source, the drain, and the substrate making up the memory cells is electrically connected the gate during the erase operation.

It is preferable in the flash memory erase operation control method according to the present invention that the potential on the common discharge circuit be set to the ground voltage during an erase operation, and it is desirable that the potential of the common discharge circuit be set to a negative potential during an erase operation.

It is preferable in the flash memory erase operation control method according to the present invention that a plurality of cells making up the flash memory circuit be divided into a plurality of groups, and that the above-described flash memory erase operation be executed for each group separately.

As described in detail above, by adopting the foregoing described technical constitution, a flash memory erase operation control method and flash memory erase operation controller according to the present invention a node that is at a high positive voltage and a node that is at a high negative voltage when an erase operation is performed are connected to a common discharge node DISCOM, so that the positive charge at the high positive voltage node is discharged to a node that is at a high negative voltage, thereby reducing the discharging to the ground potential GND, and enabling minimization of the movement of the ground potential GND within the semiconductor memory accompanying a discharge of an electrical charge when an erase operation is performed, thereby preventing faulty operation of the peripheral circuitry of the semiconductor memory.

Additionally, a current path is established between a node that is at a high positive voltage and a node that is at a high negative voltage when an erase operation is completed, thereby causing a mutual movement of electrical charges toward the ground potential GND direction, enabling avoidance of an abnormal change in voltage caused by parasitic capacitance between the gate, source, and drain of a memory cell and the substrate.

Additionally, even in discharging the source, substrate, and drain of a memory cell in which the high positive voltage of the memory cell has risen, because discharging is done after making a common connection to the common discharge node DISCOM via the N-type MOSFETs MDN4, MDN5, and MDN6, it is possible to adjust the voltage changes of the source, substrate, and drain of the memory cell to be the same at the time of the discharging.

What is claimed is:

1. A flash memory erase operation controller, which has a common discharging circuit part making a direct electrical connection between at least one of a source part, a drain part, and a substrate part making up a memory cell of a flash memory circuit and a gate part, during an erase operation.

2. The flash memory erase operation controller according to claim 1, wherein said common discharging circuit comprising a switch means causing conduction in said common discharge circuit during said erase operation.

3. The flash memory erase operation controller according to claim 1, wherein a positive voltage is applied to at least one of said source part, said drain part and said substrate part, and wherein a negative voltage is applied to said gate part.

4. The flash memory erase operation controller according to claim 1, wherein said common discharging circuit further comprises a ground voltage setting means for setting a voltage of said common discharge circuit to a ground voltage.

5. The flash memory erase operation controller according to claim 1, wherein said common discharging circuit further comprises a ground voltage fixing means for preventing a voltage of said common discharge circuit from becoming a negative potential.

6. The flash memory erase operation controller wherein said flash memory circuit has a plurality of cells which are divided into a plurality of cell groups, and wherein a flash memory erase operation controller according to claim 1, being disposed at each cell group separately, and further wherein said erase operation being performable for each cell group separate.

7. A method for controlling an erase operation, wherein in a flash memory circuit when said erase operation is carried out, at least one of a source part, a drain part, and a substrate part, each making up memory cells in a flash memory circuit, is directly electrically connected to a gate part during when said flash memory is erased.

8. The method for controlling said erase operation in said flash memory circuit according to claim 7, wherein a positive voltage is applied to at least one of said source part, said drain part, and said substrate part during said erase operation, and a negative voltage is applied to said gate part during said erase operation.

9. The method for controlling said erase operation in said flash memory circuit according to claim 7, wherein during said erase operation at least one of a source part, a drain part, and a substrate part each making up said memory cells is connected directly electrically to said gate part to function as a common discharge circuit.

10. The method for controlling said erase operation in said flash memory circuit according to claim 9, wherein said common discharge circuit is used causing conduction in said discharge circuit during said erase operation.

11. The method for controlling said erase operation in said flash memory circuit according to claim 10, wherein a potential of said common discharge circuit is set to a ground voltage during said erase operation.

12. The method for controlling said erase operation in said flash memory circuit according to claim 10, whereby processing is executing so as to prevent the occurrence of a potential of said common discharge circuit becoming a negative potential during said erase operation.

13. The method for controlling said erase operation in said flash memory circuit, wherein a plurality of cells making up said flash memory circuit is divided into a plurality of cell groups, and wherein the flash memory erase operation as defined by claim 7 is executed separately for each cell group.

* * * * *